United States Patent [19]
Bean et al.

[11] Patent Number: 5,134,090
[45] Date of Patent: Jul. 28, 1992

[54] METHOD OF FABRICATING PATTERNED EPITAXIAL SILICON FILMS UTILIZING MOLECULAR BEAM EPITAXY

[75] Inventors: John C. Bean, New Providence; George A. Rozgonyi, Chatham, both of N.J.

[73] Assignee: AT&T Bell Laboratories, Murray Hill, N.J.

[21] Appl. No.: 366,222

[22] Filed: Jun. 12, 1989

Related U.S. Application Data

[63] Continuation of Ser. No. 935,164, Nov. 25, 1986, abandoned, which is a continuation of Ser. No. 681,704, Dec. 13, 1984, abandoned, which is a continuation of Ser. No. 389,777, Jun. 18, 1982, abandoned.

[51] Int. Cl.$^5$ .................................... H01L 21/203
[52] U.S. Cl. .......................... 437/106; 148/DIG. 26; 148/DIG. 50; 148/DIG. 51; 148/DIG. 131; 437/64; 437/89; 437/90; 437/944
[58] Field of Search ............... 437/64, 89, 90, 106, 437/944; 148/DIG. 26, DIG. 50, DIG. 51, DIG. 85, DIG. 131

[56] References Cited

U.S. PATENT DOCUMENTS

| | | | |
|---|---|---|---|
| 3,316,130 | 4/1967 | Dash et al. | 148/175 |
| 3,326,729 | 6/1967 | Sigler | 148/175 |
| 3,421,055 | 1/1969 | Bean et al. | 29/578 X |
| 3,511,702 | 5/1970 | Jackson et al. | 148/174 X |
| 3,574,008 | 4/1971 | Rice | 148/175 |
| 3,600,241 | 8/1971 | Doo et al. | 148/175 |
| 3,671,338 | 6/1972 | Fujii | 148/175 |
| 3,717,514 | 3/1973 | Burgess | 148/175 |
| 3,746,908 | 7/1973 | Engeler | 148/175 X |
| 3,764,409 | 10/1973 | Nomura et al. | 1448/175 |
| 3,861,968 | 1/1975 | Magdo et al. | 29/578 X |
| 3,912,557 | 10/1975 | Hochberg | 148/175 X |
| 3,928,092 | 12/1975 | Ballamy et al. | 148/175 |
| 4,428,111 | 1/1984 | Swartz | 437/106 |

FOREIGN PATENT DOCUMENTS 1075387 7/1967 United Kingdom ............... 148/175

OTHER PUBLICATIONS

Dumke, W. P. "Bipolar Isolation Technique" IBM Tech. Discl. Bull., vol. 22, No. 7, Dec. 1979, pp. 2946-2947.
Magdo et al., "Fabricating Complementary Transitors" IBM Tech. Discl. Bull., vol.15, No. 7, Dec. 1972, pp. 2294-2295.
Jackson, D. M. , "Advanced Epitaxial . . . Integerated Circuit . . . " Trans. Metall. Soc. Aime, vol. 233, Mar. 1965, pp. 596-602.
J. C. Bean et al, "Silicon MBE Apparatus for Uniform High-Rate Deposition on Standard Format Wafers," Journal of Vacuum Science Techology, vol. 20, No. 2, Feb. 1982, pp. 137-142.
J. M. Moran et al, "High Resolution Steep Profile, Resist Patterns, " The Bell System Technical Journal, vol. 58, No. 5, May-Jun. 1979, pp. 1027-1036.
K. E. Bean et al, "Dielectric Isolation: Comprehensive, Current and Future," Journal of the Electrochemical Society, vol. 124, No. 1, Jan. 1977, pp. 5C-12C.
H. Ogawa et al, "The Selective Epitaxial Growth of Silicon by Using Silicon Nitride Film as a Mask, " Japanese Journal of Applied Physics, vol. 10, No. 12, Dec. 1971, pp. 1675-1679.

Primary Examiner—William G. Saba
Attorney, Agent, or Firm—P. A. Businger; G. E. Books

[57] ABSTRACT

A method of producing patterned epitaxial silicon films and devices fabricated thereby is described. The method forms a first layer of a refractory material on a substrate and pattern delineates the first layer. Silicon is then deposited at a temperature within the range between 400 degrees C. and 700 degrees C. and the polycrystalline material that forms is removed.

12 Claims, 1 Drawing Sheet

METHOD OF FABRICATING PATTERNED EPITAXIAL SILICON FILMS UTILIZING MOLECULAR BEAM EPITAXY

This application is a continuation of application Ser. No. 935,164, filed on Nov. 25, 1986 now abandoned, which is a continuation of application Ser. No. 681,704, filed Dec. 13, 1984 now abandoned, which was a continuation of application Ser. No. 389,777, filed Jun. 18, 1982, now abandoned.

TECHNICAL FIELD

This invention relates generally to methods for epitaxial semiconductor thin film growth and particularly to such methods that yield patterned epitaxial semiconductor films and devices, such as oxide isolated devices, fabricated using such patterned films.

BACKGROUND OF THE INVENTION

There are many areas of semiconductor device technology in which it is desired to dielectrically isolate devices fabricated on the same substrate from each other. Dielectric isolation is often desirable because it would, for example, permit higher packing density, that is, more devices could be fabricated per unit area. Accordingly, numerous techniques for obtaining dielectric isolation of devices fabricated on, for example, silicon, sapphire or gallium arsenide substrates, have been devised. Several exemplary techniques are described in the literature in the *Journal of Electrochemical Society*, 124, pp. 5c–12c, January 1977. The standardized dielectric isolation process described in this article with respect to FIG. 4 of this article unfortunately requires extensive lapping of a high perfection, thick and expensive silicon substrate although it provides good dielectric isolation. Several other methods described also require extensive lapping.

Another approach involves the growth of isolating oxide walls. For example, a technique commonly referred to as isoplanar has been developed. Channels are formed in epitaxial silicon and an oxide is then grown in the channel to isolate devices on opposite sides of the channel. This and other oxide growth methods have drawbacks. For example, silicon expands upon oxidation and a nonplanar oxide surface results and strains induced in the silicon may lead to device degradation. Thick oxide growth also requires holding the structure at high temperatures for extended periods of time. This can lead to undesirable dopant diffusion. Other methods that create channels in silicon and then fill the channels with oxide have also been developed but suffer from similar drawbacks.

Additional techniques have been developed and are described in the literature. For example, *Japanese Journal of Applied Physics*, 10, pp. 1675–1679, December 1971, describes a method for the selective epitaxial growth of silicon which uses a silicon nitride film as a mask disposed on a substrate. The silicon nitride film is deposited on the substrate, for example, silicon, and then selectively etched in those areas in which it is desired to grow epitaxial silicon to form the mask. The typical deposition technique is chemical vapor deposition, and deposition parameters, for example, pressure, are selected for which the silicon does not nucleate readily on the silicon nitride film. A typical deposition temperature for this technique is approximately 1250 degrees C. which again produces undesirable dopant diffusion. Another method for obtaining selective epitaxial growth is described in U.S. Pat. No. 3,574,008 issued on Apr. 6, 1971. The method is directed toward producing what the patentee refers to as a "Tier-type" configuration in which the side walls in a passivating layer are sloping. The desired flat surface requires lapping of the epitaxial silicon as material is not deposited on the partitions between epitaxial growth areas.

Methods for obtaining dielectric isolation have also been described for semiconductor materials other than silicon. For example, U.S. Pat. No. 3,928,092 issued on Dec. 23, 1975 to W. C. Ballamy and A. Y. Cho and assigned to Bell Telephone Laboratories, Inc. describes one such exemplary method. The method described forms a patterned amorphous surface having openings exposing a high quality substrate comprising a Group III-V compound. It is taught that when Group III-V compounds were deposited by molecular beam epitaxy that the material deposited on the single crystal material was single crystal and that the material deposited on the amorphous material was polycrystalline. The polycrystalline material has high resistivity and therefore the devices comprising single crystal Group III-V material are fabricated on the high quality substrate and are dielectrically isolated from each other. This method is, however, not useful with silicon because even polycrystalline silicon has relatively low resistivity.

Still another method developed to electrically isolate devices from each other is p-n junction isolation. However, in technologies such as CMOS (complementary metal oxide semiconductor) this requires a considerable amount of wafer surface area and complicated schemes are required to prevent latch-up.

SUMMARY OF THE INVENTION

We have found that patterned epitaxial silicon films may be produced by forming a first layer comprising a refractory material on a substrate, pattern delineating said refractory material by removing selected portions of the refractory material to expose the substrate and form a mask, depositing silicon to form epitaxial silicon on the substrate and polycrystalline silicon on said refractory material at a temperature less than 700 degrees C., and removing said polycrystalline material. The forming step may comprise depositing or growing the refractory material, for example, $SiO_2$, and the removing step may comprise lifting off or chemically etching with a selective etch. The removing, for example, lift-off, step may remove both the oxide and the polysilicon overlayer while leaving an epitaxial silicon pattern. Alternatively, the polycrystalline silicon alone could be removed using a selective chemical etch which leaves both the epitaxial silicon and the oxide mask intact. In one embodiment, the pattern delineating proceeds through the oxide layer and etching of the substrate occurs prior to the deposition step. The removing step may then remove both polycrystalline and oxide material and leave the epitaxial silicon flush with the substrate. In another embodiment, $Si_3N_4$ and a second $SiO_2$ layer are deposited on the first $SiO_2$ layer prior to the pattern delineation step. The subsequent epitaxial growth on the exposed substrate and removing steps leave epitaxial silicon patterns that are flush with the dielectric formed by the $SiO_2$ and the $Si_3N_4$.

Oxide isolation can be produced using any multilevel mask that can withstand processing and in which the top layer can be selectively etched to float off the polycrystalline silicon. This permits fabrication of devices that are dielectrically isolated laterally from each other.

In a preferred embodiment, deposition is by molecular beam epitaxy. This deposition method proceeds at a relatively low temperature and thus avoids dopant diffusion, as well as high temperature silicon and oxide degradation. Molecular beam epitaxy is also desirable because it, unlike chemical vapor deposition, is a line of sight deposition process and growth on a sharply stepped mask yields epitaxial and polycrystalline regions that are discontinuous and therefore readily separable.

DETAILED DESCRIPTION

Our invention will be illustrated by specific reference to the growth of patterned epitaxial silicon layers on a silicon substrate using an oxide mask and then by specific reference to the fabrication of several exemplary device structures. However, it should be understood that our method may be used with other substrates, such as sapphire or cubic zirconia, which lattice match or approximately lattice match to silicon. It should also be understood that any refractory material, i.e., any material that can withstand the high temperature processing, may be used to form the mask.

Figure 1:
FIGS. 1-4 schematically illustrate steps in the fabrication of free standing silicon patterns.

FIG. 1 shows a structure comprising a substrate 1 and oxide layer 3 which comprises $SiO_2$. The substrate was a 3 inch diameter (100) silicon substrate having 8Ω-cm n-type resistivity. Other substrate materials and crystal orientations could be used. The oxide layer 3 was approximately 6500 Angstroms thick and was grown by a two hour dry oxidation at approximately 1000 degrees C. followed by a four hour wet oxidation at approximately 950 degrees C. A trilevel resist coating, such as that described in the *Bell System Technical Journal*, 58, pp. 1027-1036, 1979, consisting of a thick photoresist layer, a thin chemical vapor deposition (CVD) oxide, and a thin resist layer was then deposited. The top resist layer was pattern delineated with conventional lithographic techniques such as ultraviolet photolithography. The resulting patterned line had widths varying in 0.5 μm increments from 0.5 μm. The trilevel coating and the underlying grown oxide were then patterned by reactive ion etching and the resist was then stripped. Other etching techniques may be used although the vertical side walls that reactive ion etching forms may not result. This etching yielded the structure depicted in FIG. 2.

Figure 2:

It was further found desirable to remove any contamination or damage left by the reactive ion etch by growing an additional 400 Angstrom thick dry thermal oxide on the patterned wafer. Immediately before the structure was introduced into the deposition apparatus, which was a molecular beam epitaxy system, the wafer was chemically cleaned and the final 400 Angstrom thick oxide removed by a short dilute buffered hydrofluoric acid etch. This process produced oxide steps with sharp vertical walls opening onto a clean, undamaged silicon substrate as shown in FIG. 2.

Figure 3:
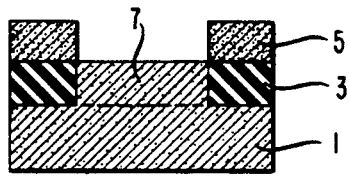
Figure 4:
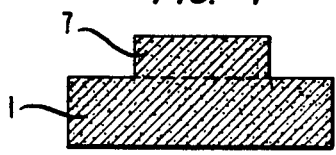

The wafers were next placed in a silicon molecular beam epitaxy deposition system such as that described in *The Journal of Vacuum Science Technology*, 20, pp. 137-142, 1982. Other suitable systems could, of course, be used. The system used is a multiple chambered, vacuum load-lock system having capabilities for uniform high rate deposition on standard 3 inch substrates. The system further includes facilities for simultaneous ion beam doping and in-situ sample cleaning as well as evaluation. All fluxes and temperatures were directly sensed and controlled to within several percent of predetermined values. Once positioned within the deposition chamber, the structures are desirably cleaned. An exemplary cleaning procedure comprises a 90 second 1 kV room temperature argon ion bombardment which removes approximately 100 Angstroms of material which is followed by a 10 minute anneal at approximately 850 degrees C. The structures were then cooled to the growth temperature and positioned facing the silicon electron beam deposition source. The shutter in front of the silicon source was then opened and silicon was deposited at the rate of approximately 5 Angstroms/second until a thickness of approximately 5000 Angstroms was obtained. The deposition atmosphere was predominately hydrogen having a pressure of approximately $10^{-8}$ Torr. The structures were then cooled to room temperature and removed from the molecular beam epitaxy system. The resulting structure is that depicted in FIG. 3 which has a polysilicon layer 5 which grew over the oxide layer and epitaxial silicon 7 which grew lattice matched to the substrate. The epitaxial silicon may have the same conductivity type as the substrate or a complementary type. The conductivity type of the epitaxial silicon is easily controlled by shutters between appropriate dopant sources and the substrate. The structures were then placed in an ultrasonic HF acid bath for approximately one hour to dissolve the masking oxide and lift-off the polysilicon regions 5 to produce the structure having a cross-section as shown in FIG. 4.

There are two parameters that are often critical and should typically be considered in optimizing the growth process. First, there is cleaning of the structure after pattern delineation. With oxide patterned wafers being used, additional photoresist contamination was expected and chemical, such as HF cleaning steps had to be carefully controlled to minimize mask degradation. With a deeply channeled groove, i.e., a groove having the depth comparable to or greater than the width, chemical and sputter cleaning techniques might be less effective. This is true because the etchant may not completely wet the groove or there may be a stagnant zone at the bottom of the groove. Furthermore, in-situ sputtering might actually transfer material from the outside mask to the adjacent silicon windows. However, it was found that the addition of a 400 Angstrom thick thermal oxidation and lift-off step in the chemical cleaning sequence and structure rotation during the in-situ sputter cleaning proved adequate to produce high quality epitaxial silicon. Of course, for other structures, other cleaning steps might be adequate.

The second critical growth parameter is the substrate temperature. The desirable range for a substrate temperature during deposition is determined by the following considerations. First, the temperature must exceed approximately 400 degrees C. to produce crystalline molecular beam epitaxy growth. Temperatures below 400 degrees C. might be used but additional processing steps will be required to transform the deposited polycrystalline silicon to single crystal silicon. Second, to avoid dopant diffusion, the substrate temperature should be less than approximately 900 degrees C. Higher growth temperatures might remove residual oxide contamination by evaporation proceeding by the reaction $SiO_2$ (s)$\rightarrow$SiO (v)+$\frac{1}{2}$ $O_2$ (v), but too high a growth temperature will etch the oxide mask and contaminate the epitaxial silicon via the reduction reaction Si(v)+$SiO_2$ (s)$\rightarrow$2SiO (v).

It was found that at a growth temperature of approximately 800 degrees C., the polycrystalline silicon deposited on the oxide mask had an appearance which suggested oxide etching. Furthermore, when the samples were etched in a Schimmel dislocation etch and examined by Nomarski microscopy, it was evident that the edges of the silicon epitaxial runners also had a high dislocation density. This finding regarding dislocation density is consistent with the presence of both oxide etching and epitaxial silicon contamination. However, when the growth temperature was lowered to 600 degrees C., all surfaces were optically smooth. The dislocation etch did not attack the epitaxial silicon runners and under high magnification, no etch pits were detected. The substrate temperature should therefore be within the range between approximately 400 and approximately 700 degrees C.

Growth morphologies were assessed in various stages of the growth process by cleaving through the patterns, coating with gold and examining the structure with a scanning electron microscope. It was found that reactive ion etching and the precleaning sequence produced a sharp vertical wall oxide pattern. It was further found that after the molecular beam epitaxy deposition, the channels were filled with an unfaceted silicon deposit and that the oxide was overgrown with a distinctly rough polycrystalline silicon deposit. After the ultrasonic HF lift-off, it was found that the oxide mask was completely dissolved and polysilcon runners lifted off leaving the free standing silicon pattern comprising runners which represented a negative of the original mask pattern.

Figure 5:
FIGS. 5-7 schematically represent steps in the fabrication of epitaxial silicon lines that are flush with the substrate.
Figure 6:
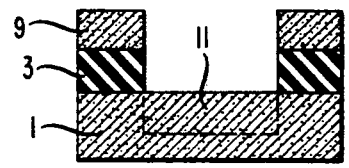
Figure 7:
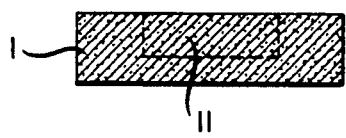
Figure 8:
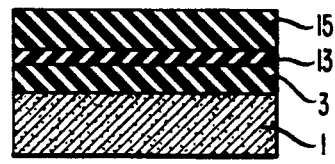
FIGS. 8-11 schematically illustrate steps in the fabrication of silicon lines and devices that are flush with dielectric material.
Figure 9:
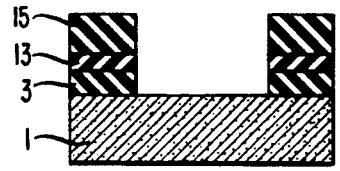
Figure 10:
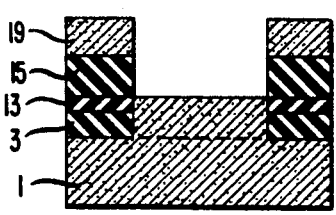
Figure 11:
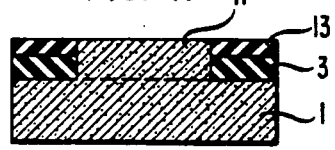

Modifications of the method described with respect to FIGS. 1-4 are contemplated. For example, one such modification is schematically depicted in FIGS. 5-7. The structure depicted in FIG. 5 results from continuing the etching of the structure depicted in FIG. 1 during the pattern delineation step into the substrate. After the substrate has been etched and yielded the structure depicted in FIG. 5, the deposition of silicon proceeds yielding the structure depicted in FIG. 6 which has polycrystalline silicon 9 and epitaxial silicon 11 on the oxide layer and in the silicon substrate, respectively. The HF lift-off process then produces the structure depicted in FIG. 7 which has epitaxial silicon runners which are flush with the substrate. Epitaxial silicon 11 and substrate 3 may have the same or opposite conductivity types.

Yet another contemplated modification is schematically depicted in FIGS. 8-11. The structure depicted in FIG. 8 comprises substrate 1, first oxide layer 3, $Si_3N_4$ layer 13 and second oxide layer 15. The oxide layers may comprise $SiO_2$. All three layers comprise a refractory material. This structure is then pattern delineated, as previously described, yielding the structure depicted in FIG. 9. This structure is then placed into the molecular beam epitaxy deposition apparatus and silicon is deposited on the structure. Epitaxial silicon 17 grows on the substrate while polycrystalline silicon 19 is deposited on the oxide layer. The HF etch then lifts off the top $SiO_2$ layer and the polysilicon material yielding the structure depicted in FIG. 11. Alternatively a $SiO_2$/$Si_3N_4$ mask could be used and a hot phosphoric acid etch used to dissolve the nitride and float off the polycrystalline silicon. This structure has silicon runners which are flush with the dielectric material.

Figure 12:
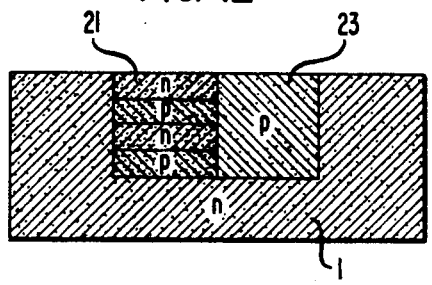
FIG. 12 schematically illustrates one structure fabricated by our invention.

Several exemplary device structures and their fabrication sequence will be briefly described to illustrate device structures that may be fabricated with our invention. One such structure is depicted in FIG. 12. This structure comprises an n-type substrate, a plurality of alternating n- and p-type layers 21, and p-type layer 23. This structure is fabricated according to FIGS. 5-7 to produce the alternating conductivity type layers 21 and then repeating the process to produce the p-type layer 23. The resulting interdigitated structure is useful as, for example, an avalanche photodetector.

Figure 13:
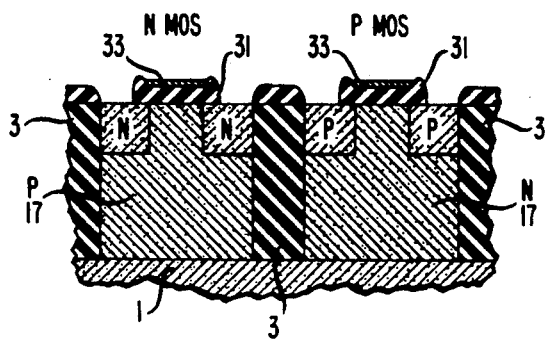
FIG. 13 schematically illustrates a CMOS structure fabricated by our invention.

Still another device structure is depicted in FIG. 13. The structure comprises substrate 1, oxide 3, and epitaxial silicon 17 regions separated by oxide 3. One region has p-type conductivity and the other has n-type conductivity. Each region has two regions with opposite conductivity type which are formed by, for example, diffusion or ion implantation. The structure further comprises gate oxides 31 and gate electrodes 33. Additionally, appropriate doping will reduce the possibility of latch-up. As will be readily appreciated by those working in the art, this is a CMOS structure. In view of the previous discussion, methods of fabricating this structure by the method of our invention will be readily apparent to those of ordinary skill in the art.

What is claimed is:

1. In the manufacture of semiconductor devices, a method for fabricating patterned silicon structures; said method comprising the steps of forming a first layer of a refractory material on a substrate, said refractory material comprising $SiO_2$, pattern delineating said first layer to form a pattern-delineated structure, thereby exposing a portion of said substrate, cleaning the exposed portion of said substrate after pattern-delineating by a process comprising thermally oxidizing the surface of said portion and lifting off the oxidized surface;

depositing silicon to form epitaxial silicon on said portion, and polycrystalline silicon on said first layer, said depositing being by molecular beam epitaxy at a temperature which is in the range from approximately 400 degrees C. to approximately 600 degrees C., whereby etching of said refractory material is prevented during silicon deposition, and silicon being deposited to form polycrystalline silicon on said refractory material is prevented from reacting with said refractory material, thereby leaving said epitaxial silicon essentially free of reaction-producing contaminants, and removing said polycrystalline material.

2. A method as recited in claim 1 in which pattern delineating results in removal of substrate material.

3. A method as recited in claim 1 comprising the further steps of depositing at least a second layer comprising a refractory material on said first layer.

4. A method as recited in claim 3 in which said second layer comprises $Si_3N_4$.

5. A method as recited in claim 3 comprising the further step of depositing a third layer on said second layer, said third layer comprising $SiO_2$.

6. A method as recited in claim 5 comprising the further step of removing said third layer.

7. A method as recited in claim 6 comprising the further step of removing said first layer.

8. A method as recited in claim 1 in which pattern delineating comprises etching by reactive ion etching prior to said depositing.

9. A method as recited in claim 1 in which said removing is by lift-off.

10. A method as recited in claim 1 in which said removing is by selective chemical etching.

11. A method as recited in claim 1 in which said depositing produces at least two layers of opposite conductivity.

12. A method as recited in claim 1 comprising the further steps of repeating the steps of claim 1.

* * * * *